United States Patent [19]
Osborne

[11] 4,146,779
[45] Mar. 27, 1979

[54] DISPLAY CONTROLLER FOR TIME RECORDERS AND TIME ACTUATORS

[75] Inventor: Paul W. Osborne, Neptune, N.J.

[73] Assignee: Osborne-Hoffman, Inc., Point Pleasant Beach, N.J.

[21] Appl. No.: 772,909

[22] Filed: Feb. 28, 1977

[51] Int. Cl.$^2$ ............................................. H03K 27/00
[52] U.S. Cl. .............................. 235/92 T; 235/92 SH; 235/92 SA; 235/92 R
[58] Field of Search ............ 235/92 T, 92 ST, 92 EA, 235/92 SH, 92 PE, 92 SA; 58/23 R

[56] References Cited
U.S. PATENT DOCUMENTS

| | | | |
|---|---|---|---|
| 3,636,319 | 1/1972 | Nixon | 235/92 ST |
| 3,656,122 | 4/1972 | Pasternack | 235/92 SH |
| 3,798,428 | 3/1974 | Izawa | 235/92 SH |
| 3,883,867 | 5/1975 | Hatano et al. | 235/92 ST |
| 3,967,095 | 6/1976 | Herring et al. | 235/92 ST |
| 3,971,920 | 7/1976 | Johnson | 235/92 SH |
| 3,984,662 | 10/1976 | Sorenson | 235/92 SH |
| 3,986,333 | 10/1976 | Kimura et al. | 235/92 SH |

*Primary Examiner*—Joseph M. Thesz

[57] ABSTRACT

A display controller interacts with a plurality of time recorders and time actuators such that the display controller displays the time recorded in a plurality of time recorders, and controls the predetermined sequence of output states in a plurality of time actuators. Time recorders and time actuators of small size and low power consumption result from the use of this invention.

5 Claims, 6 Drawing Figures

DISPLAY CONTROLLER FOR TIME RECORDERS AND TIME ACTUATORS

SUMMARY

The field of this invention relates to event timers and to time actuators.

The recent development of semiconductor integrated circuits permits considerable reductions in the size of timing devices over older, mechanically controlled devices. Size is important in many fields, including those of biology and medicine, and in applications where the devices may be subjected to shock. The power consumption of these devices needs to be low in applications where long time intervals in the field are measured or controlled. In this invention, the display controller interacts with a plurality of time recorders and time actuators and performs the display and control functions for each. The time recorder records the time of occurrence of events. The time actuator produces a predetermined sequence of output states. Since many time recorders and time actuators share one display controller which performs the display and control functions for each, this invention results in a time recorder and time actuator of small size, low power consumption, and low cost. Moreover, the digital implementation of the circuits yields improved accuracy in timing over mechanical devices.

It is an object of this invention to provide a time actuator and a timer recorder of small size, low power, and high accuracy. It is a further object of this invention to develop a device which produces the display and control functions for a plurality of time recorders and time actuators.

It is also an object of this invention to minimize the number of ports over which the recorded time is presented by the time recorder to the display controller.

It is also an object of this invention to minimize the number of ports over which the predetermined time of output sequence states are presented by the display controller to the time actuator.

DRAWING

Figure 1:
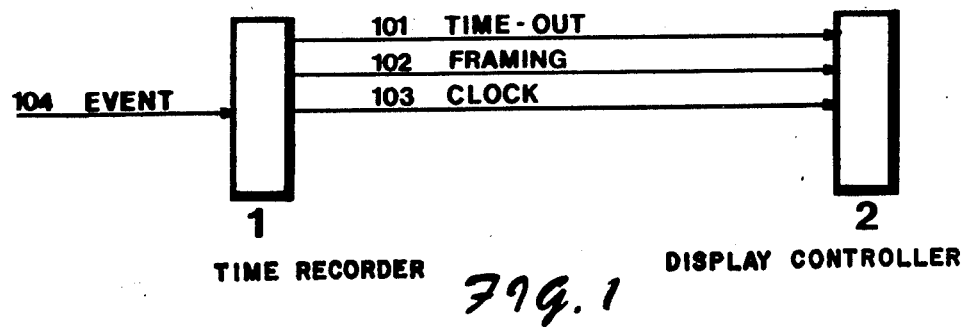
FIG. 1 shows the interaction between a time recorder and the display controller.

Reference is made to FIG. 1 which shows the interaction between the time recorder 1 and the display controller 2. This interaction occurs over interconnecting lines 101, 102, and 103. Time information recorded in the time recorder is emitted over time-out line 101 in serial digital format.

Because of the serial format, the recorded time is available at a single output port. This minimizes the number of interconnections between time recorder 1 and display controller 2. The framing signal on line 102 and the clock signal on line 103 are used in synchronizing the display controller to the serial time data on line 101. The occurrence of the event which is timed is signaled to the time recorder over line 104. Connecting lines 101, 102, and 103 from the display controller to any one of a plurality of time recorders enables the display controller to decode and display the time of the event measured by that time recorder.

Figure 2:
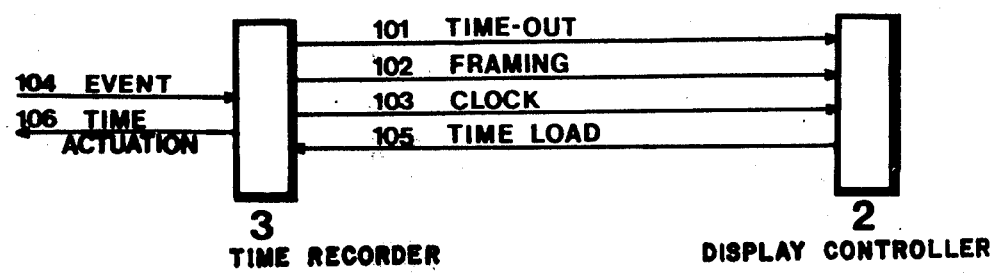
FIG. 2 shows the interaction between a time actuator and the display controller.

Reference is made to FIG. 2 which shows the interaction between a time actuator 3 and the display controller 2. The time actuator includes interconnecting lines 101, 102, and 103 which also form part of the time recorder 1, and input line 104. Time load line 105 is an interconnecting line in addition to the three named above. The predetermined actuating time is loaded into the time actuator over line 105. The time actuation signal is emitted over output line 106. Connecting lines, 101, 102, 103, and 104 from the display controller to any one of a plurality of time actuators enables the display controller to enter the predetermined time at which the actuation signal will appear at the output of that time actuator.

Figure 3:
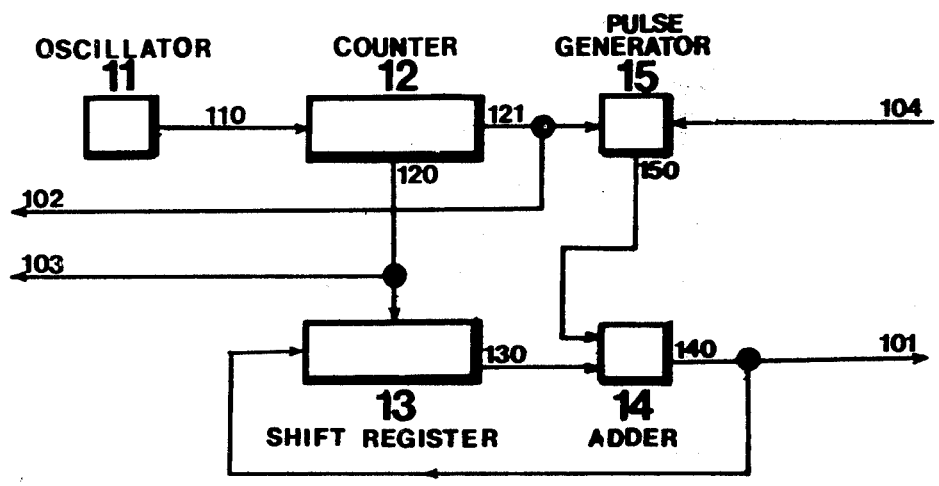
FIG. 3 shows an implementation of a time recorder which records the time of occurrence of events.

Reference is made to FIG. 3 which shows an implementation of a time recorder. A digital clock 11 pulses a counter 12 by emitting a precise stream of digitally controlled pulses over line 110. The counter is composed of several stages of digital division. The number of stages of division in the counter determines the length of time and the accuracy with which time is measured. The output of an early division stage in counter 12 appears on line 120 and provides a clock pulse which advances shift register 13 and is the clock pulse output on line 103. The output of shift register 13 on line 130 provides one input to adder 14. A later division stage in counter 12 provides a framing pulse output on lines 102 and 121. The division of the counter between the signal on line 120 and that on line 121 corresponds to the number of stages in shift register 13. The signal on line 121 occurs at the end of each frame, which is a complete cycle of the shift register. The signal on line 121 triggers a pulse generator 15 which provides an output pulse over line 150 once for each frame. The pulse on line 150 is the second input to adder 14. The output of adder 14 appears on line 101 and 140 and is recirculated into shift register 13, augmenting thereby the contents of the shift register by counts of one for every frame which has transpired. The count contained in shift register 13 is the binary number corresponding to the number of elapsed frames. When the event to be timed occurs, a trigger signal on line 104 inhibits pulse generator 15. No further pulses can be added to shift register 15 every frame, once the event occurs. Line 101 contains the serial digital representation of the count in shift register 13. Recirculating this data over line 140 results in retaining the data in shift register 13 while the data is serially shifted out on line 101. It is obvious that more than one event may be timed by adding as many shift registers, adders, and pulse generators as there are events to be timed.

Figure 4:
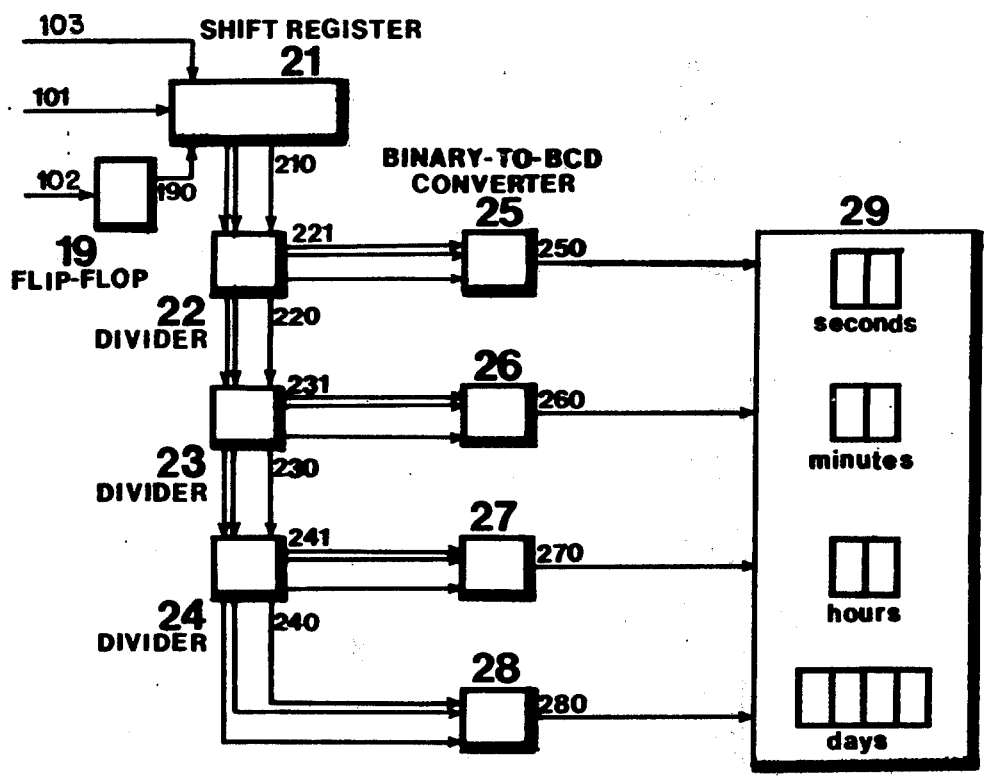
FIG. 4 shows an implementation of a display controller which controls a plurality of time recorders, and displays time.

Reference is made to FIG. 4 which shows an implementation of a display controller for time recorders. The time out data is presented to shift register 21 over input line 101. The clock signal over line 103 shifts the serial digital data into shift register 21 when flip-flop 19 is set. The framing signal over line 102 causes flip-flop 19 to be set. The output of flip-flop 19 appears over line 190 and causes shift register 21 to be loaded. The output of shift register 21 appears over a plurality of lines 210 and forms the input to the first of a succession of dividers 22 which causes the input to be divided by 60. The result of divider 22 appears on a plurality of lines 220 and forms the input to divider 23, which causes the input to be divided by 60 again. The remainder of divider 22 appears on a plurality of lines 221 and is the binary representation in seconds of the fraction of a minute of the time recorded in the time recorder. The result of divider 23 appears on a plurality of lines 230 and forms the input to divider 24, which causes the input to be divided by 24. The remainder of divider 23 appears on a plurality of lines 231 and is the binary representation in minutes of the fraction of an hour of the time recorded in the time recorder. The result of divider 24 appears on a plurality of lines 240 and is the binary representation in days of the time recorded in the time recorder. The remainder of divider 24 appears on a plurality of lines 241 and is the binary representation in hours of the fraction of an hour of the time recorded in the time recorder. The data on lines 221, 231, 241, and 240 forms the input to the binary to BCD (binary coded decimal) converters 25, 26, 27, and 28 respectively. The outputs of binary to BCD converters 25, 26, 27, and 28 appear on lines 250, 260, 270, and 280 respectively, and form the inputs to display 29. Display 29 consists of a numeric display made of modules which display time in numeric form in days, hours, minutes and seconds. The time of occurrence of events is displayed in units of time other than days, hours, minutes and seconds by selecting different division factors in dividers 22, 23, and 24. Further, it is obvious that this implementation is extendable to display many events from a plurality of time recorders. Alternatively to the use of lines 102 and 103, framing is acquired by a non-binary signal level on line 101 and the clock signal is extracted directly from the data on line 101. The non-binary signal on line 101 is generated by the addition of a voltage to the bit stream in the time recorder at the instant of framing. The clock signal is extracted by a phase-locked loop in the display controller with line 101 forming the input to the phase-locked loop and the output of the phase-locked loop replacing line 103 as an input to shift register 19.

Reference is made to FIG. 2 which shows the interaction between a time actuator 3 and the display controller 2. The time actuator 3 includes interconnecting lines 101, 102, and 103, input line 104, and output line 105 of time recorder 2. The time load line 105 is an additional interconnecting line over which the actuating time is loaded into the time actuator and output line 106 is an additional output line over which the actuating time appears in the form of a sequence of digital states. These digital states control devices which are under the supervision of the time actuator.

Figure 5:
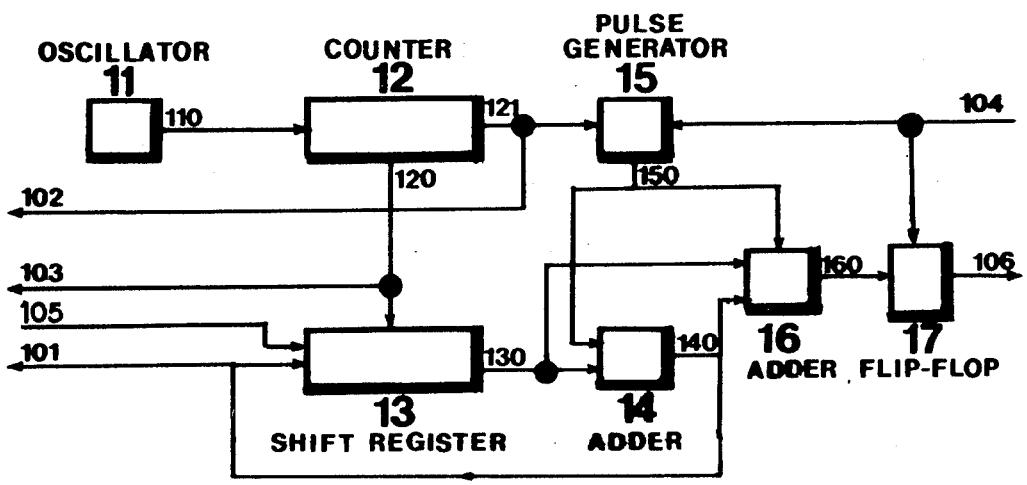
FIG. 5 shows an implementation of a time actuator which produces a sequence of predetermined output states.

Reference is made to FIG. 5 which shows an implementation of a time actuator. The time actuator includes adder 16 and flip-flop 17 in addition to ossillatar 11, counter 12, shift register 13, adder 14 and pulse generator 15 which form time recorder 1 of FIG. 2. The actuating time is loaded in serial digital format into shift register 13 over input line 105 by the display controller. Clock 11 drives counter 12 which generates pulses which shift the data in shift register 13 as described in the operation of the time recorder. Pulse generator 15 and adder 14 also function as previously described in the operation of the time recorder and produce a recirculating input over line 140 for shift register 13, which augments the count in the shift register every framing period. The actuating time is reached when the count in the shift register is zero. The output of shift register 13 on line 130 and the output of adder 14 on line 140 form the inputs to adder 16. The output of pulse generator 15 strobes adder 16 over line 150 by producing a pulse every framing cycle. The output of shift register 13 reaching zero causes the output of adder 16 to become zero. This ia demonstrated by considering the following stream of data:

| Line 130: | | 111111 | ..... | 111 | cycle before timing |
| Line 150: | + | | | 1 | is reached |
| Line 140: | (1) | 000000 | ..... | 000 | carry = 1 |
| Line 130: | | 000000 | ..... | 000 | timing is reached |
| Line 150: | + | | | 1 | |
| carry = 1: | + | | | 1 | |
| Line 140: | | 0000000 | ..... | 010 | |

When the time for timing actuation is reached, shift register 13 contains all zeroes and the least significant bit on line 140 does not change. This is the only time that this bit does not change. Adder 16 adds the least significant bit on line 130 and that on line 140. When the resultant output on line 160 is zero, flip-flop 17 is caused to be set. The output of flip-flop 17 appears on line 106 and changes level when flip-flop 17 is set. This level remains in the set position until flip-flop 17 is caused to be reset by the external event line 104. When flip-flop 17 is reset, the output on line 106 returns to the reset level. It is obvious that the circuit of FIG. 5 may function as a time recorder, or as a time actuator, or as both a time recorder and a time actuator.

Figure 6:
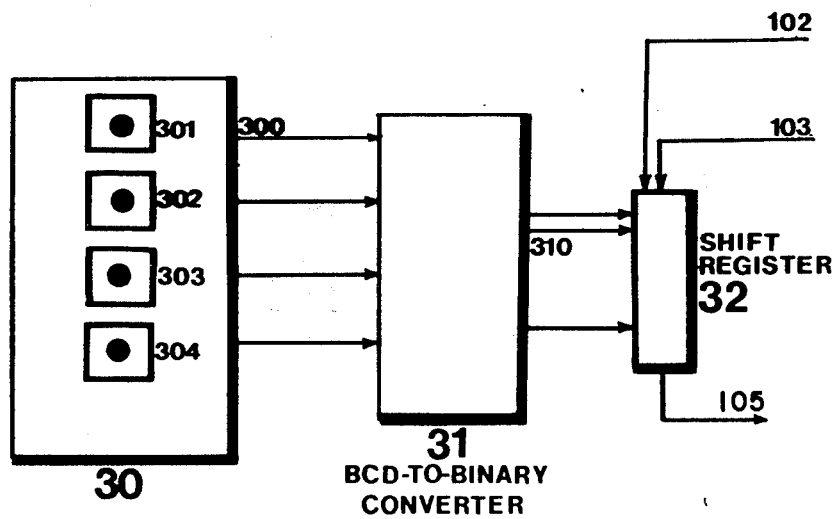
FIG. 6 shows an implementation of a display controller which controls a plurality of time actuators.

Reference is made to FIG. 6 which shows an implementation of a display controller to control a time actuator. Selector panel 30 comprises control knobs 301, 302, 303, and 304 which produce BCD signals on a plurality of lines 300. Actuating time is selected in days by knob 301, in hours by knob 302, in minutes by knob 303, and in seconds by knob 304. The BCD to binary converter 31 converts the BCD data on lines 300 to binary data on lines 310. The binary data on lines 310 enters shift register 32 in parallel. Clock pulses on line 103 cause the data in shift register 32 to be shifted out serially over line 104 which transfers the actuating time to the time actuator. The framing signal on line 102 lifts the inhibiting of the clock pulses on line 103 and permits the clock pulses to begin shifting out the data serially.

The implementation of FIG. 6 is combined with the implementation of FIG. 4 to result in a display controller which displays the time recorded in time recorders and which controls the actuating time in time actuators.

I claim:

1. A device for recording the time of occurrence of an event and transmitting said time of occurrence over a single output line in binary serial format, one bit a time, comprising:
   (a) an input line over which a triggering signal is applied upon occurrence of an event,
   (b) a digital clock emitting clock pulses,
   (c) a counter generating shifting pulses and a trigger pulse each frame driven by clock pulses from said digital clock,
   (d) a shift register whose contents are shifted by shifting pulses from said counter, the length of the shift register being equal to one frame,
   (e) a pulse generator triggered by said counter generating a pulse each frame until halted by an external triggering signal upon occurrence of an event,
   (f) an adder driven by said pulse generator and said shift register and recirculating its output to said shift register thereby augmenting the count of pulses in said shift register until the occurrence of an event, and maintaining the count thereafter, (g) a single output line over which the content of said shift register is transmitted in binary serial format one bit at a time.

2. A device used in combination with a plurality of time recorders of claim 1, said device receiving recorded time in binary serial format over a single line from any one of said time recorders, comprising:

(a) a single input line providing means for receiving recorded time in binary serial format one bit at a time, (b) means for converting said binary serial signal into BCD format, and (c) a display driven by said BCD signals showing time recorded numerically in days, hours, minutes and seconds.

3. A time actuator providing level shifting signal means over a time actuation line at preprogrammed times, said preprogramming being provided over a single time load line, comprising:

(a) said time load line providing means of presetting the count in a shift register, (b) a digital clock emitting clock pulses, (c) a counter generating shifting pulses and a trigger pulse each frame driven by clock pulses from said digital clock, (d) said shift register preset by serial pulses from the time load line, whose contents are shifted by shifting pulses from said counter, the length of the shift register being equal to one frame, (e) a pulse generator triggered by said counter generating a pulse each frame, (f) an adder driven by said pulse generator and said shift register and recirculating its output to said shift register thereby augmenting the count of pulses in said shift register until the shift register has been filled following which cycle time actuation is reached, (g) a second adder driven by said shift register and said first adder resulting in a reset pulse at the output of the second adder, and (h) a flip-flop having its state reset by a reset pulse from said second adder when time actuation is reached.

4. A time recorder in combination with a time actuator wherein both functions of time recording and time actuation are obtained comprising the elements of claim 3 and, (a) an input line over which a triggering signal is applied to said pulse generator upon occurrence of an event, (b) a single output line over which the content of said shift register is transmitted in binary serial format one bit at a time, and (c) means for recirculating contents of said shift register thereby maintaining recorded time in said shift register while simultaneously transmitting recorded time.

5. A device used in combination with a plurality of time actuators of claim 3, said device transmitting actuating time in binary serial format over a single connecting line to any one of said time actuators, comprising:

(a) a selector panel for selecting said actuating time numerically in days, hours, minutes and seconds (b) means for converting said actuating time into binary serial format, and (c) a single output line for transmitting said actuating time one bit at a time to any one of said time actuators.

* * * * *